United States Patent
Liu et al.

(10) Patent No.: US 10,199,441 B2
(45) Date of Patent: Feb. 5, 2019

(54) PIXEL STRUCTURE AND DISPLAY PANEL

(71) Applicant: AU OPTRONICS CORPORATION, Hsin-chu (TW)

(72) Inventors: Chan-Jui Liu, Hsin-chu (TW); Pei-Yun Wang, Hsin-chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 0 days.

(21) Appl. No.: 15/660,040

(22) Filed: Jul. 26, 2017

(65) Prior Publication Data

US 2018/0033843 A1 Feb. 1, 2018

(30) Foreign Application Priority Data

Jul. 28, 2016 (TW) .............................. 105123836 A

(51) Int. Cl.
*H01L 27/32* (2006.01)
*G02F 1/1333* (2006.01)
(Continued)

(52) U.S. Cl.
CPC ........ *H01L 27/3246* (2013.01); *G02F 1/1368* (2013.01); *G02F 1/133305* (2013.01); *G02F 1/136286* (2013.01); *H01L 27/1255* (2013.01); *H01L 27/3244* (2013.01); *H01L 27/3248* (2013.01); *H01L 27/3276* (2013.01); *H01L 51/0097* (2013.01); *G02F 2201/123* (2013.01); *H01L 2251/5338* (2013.01)

(58) Field of Classification Search
CPC ............ H01L 27/3246; H01L 27/1255; H01L 27/3244; H01L 27/3248; H01L 27/3258; H01L 27/32; H01L 27/3206; H01L 27/3211; H01L 27/322; G02F 1/1368; G02F 1/133305; G02F 1/136286; G02F 2201/123
See application file for complete search history.

(56) References Cited

U.S. PATENT DOCUMENTS

2007/0190233 A1* 8/2007 Chung ................ H01L 51/0005
427/58
2010/0187979 A1* 7/2010 Shim ................. G02F 1/133305
313/504
(Continued)

FOREIGN PATENT DOCUMENTS

TW 201603247 * 1/2016 ............ H01L 27/12
TW 201603247 A 1/2016

*Primary Examiner* — Galina Yushina
(74) *Attorney, Agent, or Firm* — Tim Tingkang Xia, Esq.; Locke Lord LLP

(57) ABSTRACT

A display panel includes a first substrate, a plurality of first signal lines, a plurality of second signal lines, and a plurality of pixel electrodes. The first substrate has at least one bendable area and two non-bendable areas. The at least one bendable area is located between the two non-bendable areas. One of the first signal lines and one of the second signal lines are electrically connected to at least one subpixel. Each of the a subpixels includes a control unit, and the control units are provided only in the non-bendable areas and are not provided in the bendable area. The pixel electrodes are provided in the bendable area and the non-bendable areas. Each of the controls units is electrically connected to one of the pixel electrodes.

13 Claims, 8 Drawing Sheets

(51) Int. Cl.
*G02F 1/1362* (2006.01)
*G02F 1/1368* (2006.01)
*H01L 27/12* (2006.01)
*H01L 51/00* (2006.01)

(56) References Cited

U.S. PATENT DOCUMENTS

2012/0062447 A1    3/2012   Tseng et al.
2017/0069697 A1*   3/2017   Hashimoto ......... H01L 27/3216

* cited by examiner

PIXEL STRUCTURE AND DISPLAY PANEL

CROSS-REFERENCE TO RELATED PATENT APPLICATION

This non-provisional application claims priority to and benefit of, under 35 U.S.C. § 119(a), Patent Application No. 105123836 filed in Taiwan R.O.C. on Jul. 28, 2016. The entire contents of the above identified application is incorporated hereby by reference.

Some references, which may include patents, patent applications and various publications, are cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD

The present disclosure relates to a pixel structure and a display panel, and in particular, to a display panel that is not provided with a control unit in a bendable area.

BACKGROUND

In recent years, as requirements of users for electronic products are increased, display panels (display panel) that play an import role in electronic products also become a focus of designers. In current display technologies, flexible display panels have become a developing focus of new-generation display technologies because of attributes, for example, high lightness, shock resistance and flexibility.

However, in a general flexible display panel, film layers or elements in a bendable area may be usually damaged or broken due to bending, and further a yield or reliability of the flexible display panel may be lowered; consequently, development of the flexible display panel is seriously affected.

SUMMARY

One aspect of the present disclosure provides a pixel structure, which includes a first substrate, a plurality of first signal lines, a plurality of second signal lines, and a plurality of pixel electrodes. The first substrate has at least one bendable area and at least one non-bendable area. The first signal lines and the second signal lines are provided on the first substrate, where one of the first signal lines and one of the second signal lines are electrically connected to at least one subpixel, and each of the subpixels includes a control unit, and the control units are provided only in the non-bendable areas and are not provided in the bendable area. The pixel electrodes are provided in the bendable area and the non-bendable areas adjacently side by side, where each of the control units is electrically connected to one of the pixel electrodes.

These and other aspects of the present disclosure will become apparent from the following description of the preferred embodiment taken in conjunction with the following drawings, although variations and modifications therein may be effected without departing from the spirit and scope of the novel concepts of the present disclosure.

BRIEF DESCRIPTION OF THE DRAWINGS

The accompanying drawings illustrate one or more embodiments of the present disclosure and together with the written description, serve to explain the principles of the present disclosure. Wherever possible, the same reference numbers are used throughout the drawings to refer to the same or like elements of an embodiment, and wherein.

DETAILED DESCRIPTION

Figure 1:
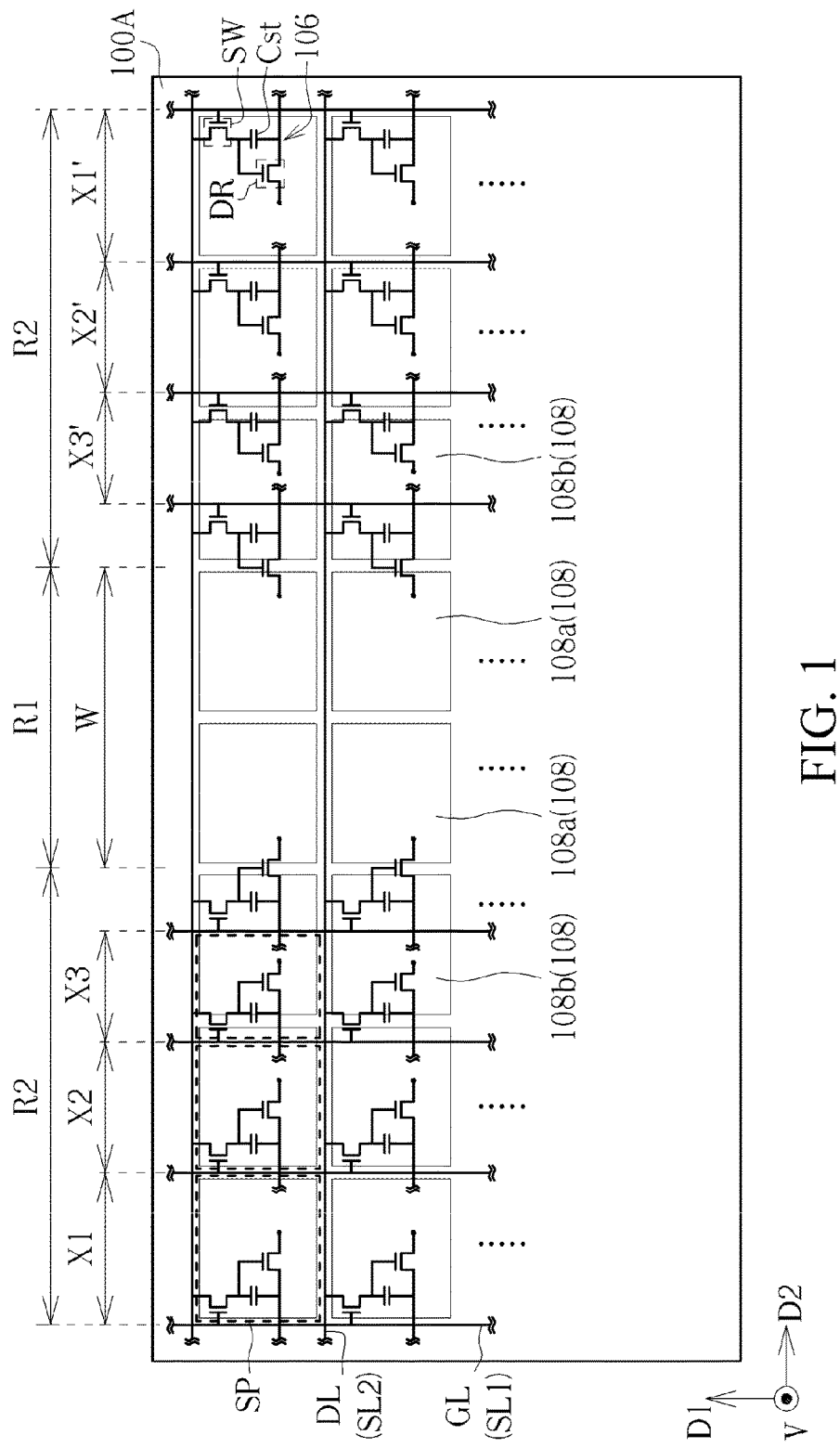
FIG. 1 is a schematic top view of a first substrate of a display panel of a first embodiment of the present disclosure.

The present invention is more particularly described in the following examples that are intended as illustrative only since numerous modifications and variations therein will be apparent to those skilled in the art. Various embodiments of the invention are now described in detail. Referring to the drawings, like numbers indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise. Moreover, titles or subtitles may be used in the specification for the convenience of a reader, which shall have no influence on the scope of the present invention.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the terms "comprising", "including", "carrying", "having", "containing", "involving", and the like are to be understood to be open-ended, i.e., to mean including but not limited to.

The disclosure will be described more fully hereinafter with reference to the accompanying drawings, in which exemplary embodiments of the disclosure are shown. As those skilled in the art would realize, the described embodiments may be modified in various different ways, all without departing from the spirit or scope of the disclosure.

In the drawings, the thickness of layers, films, panels, regions, etc., are exaggerated for clarity. Like reference numerals designate like elements throughout the specification. It will be understood that when an element such as a layer, film, region, or substrate is referred to as being "on" or "connected to" another element, it can be directly on or connected to the other element or intervening elements may also be present. In contrast, when an element is referred to as being "directly on" or "directly connected to" another element, there are no intervening elements present. As used herein, "connected" may refer to a physical and/or electrical connection.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Figure 2:
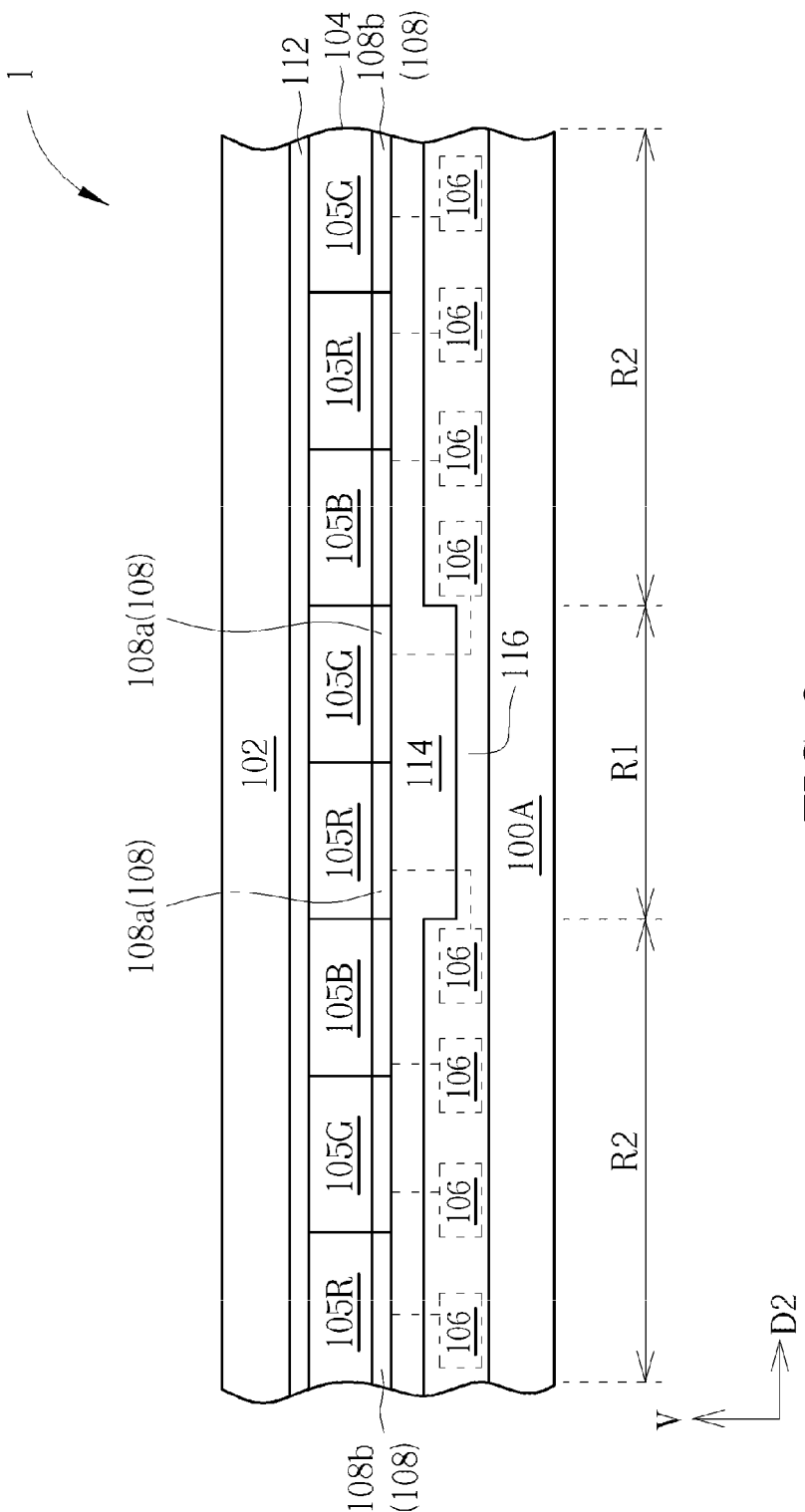
FIG. 2 is a schematic diagram of element configuration of a display panel of a first embodiment of the present disclosure.
Figure 3:
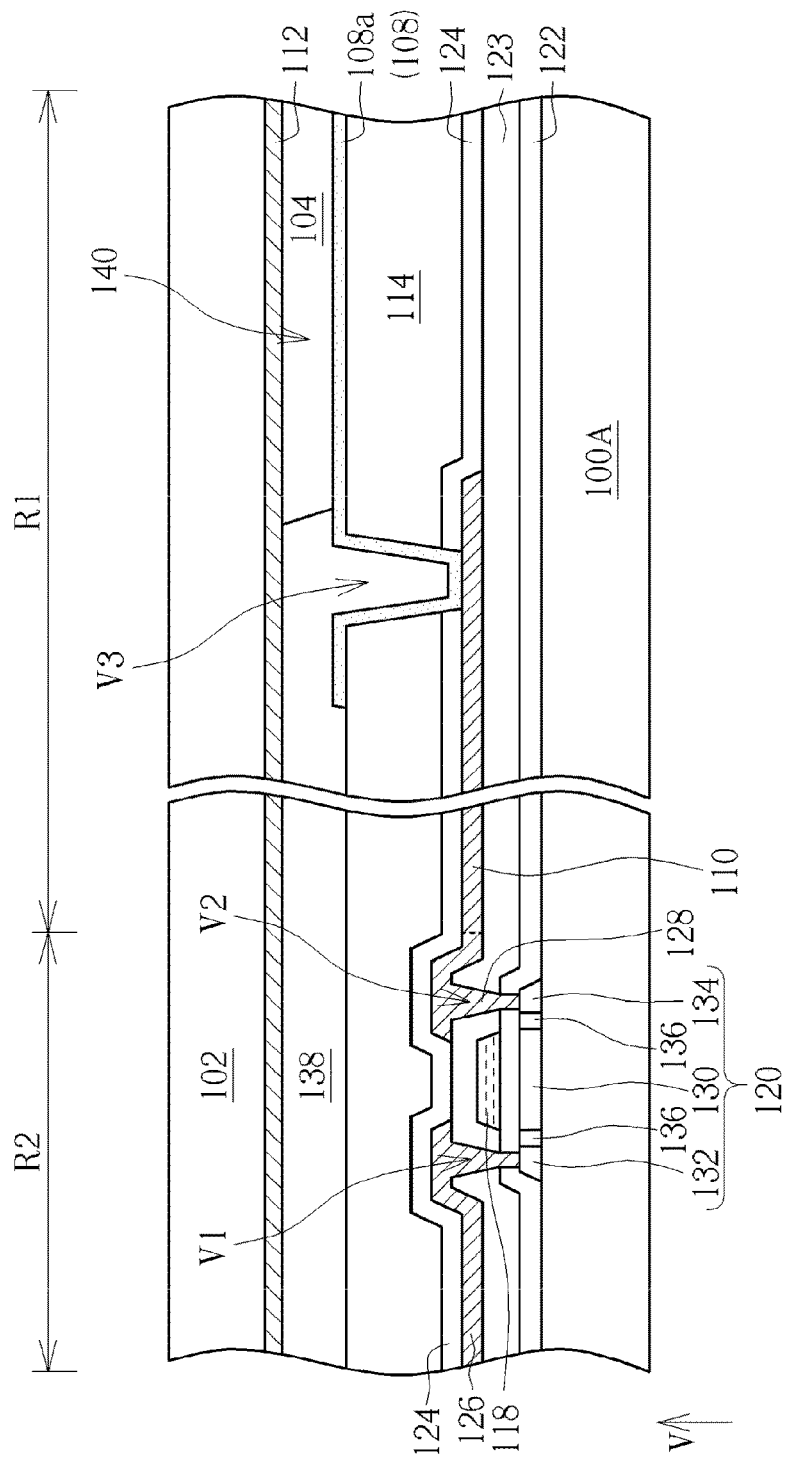
FIG. 3 is a schematic sectional view of a drive element electrically connected to a first pixel electrode according to FIG. 2.
Figure 4:
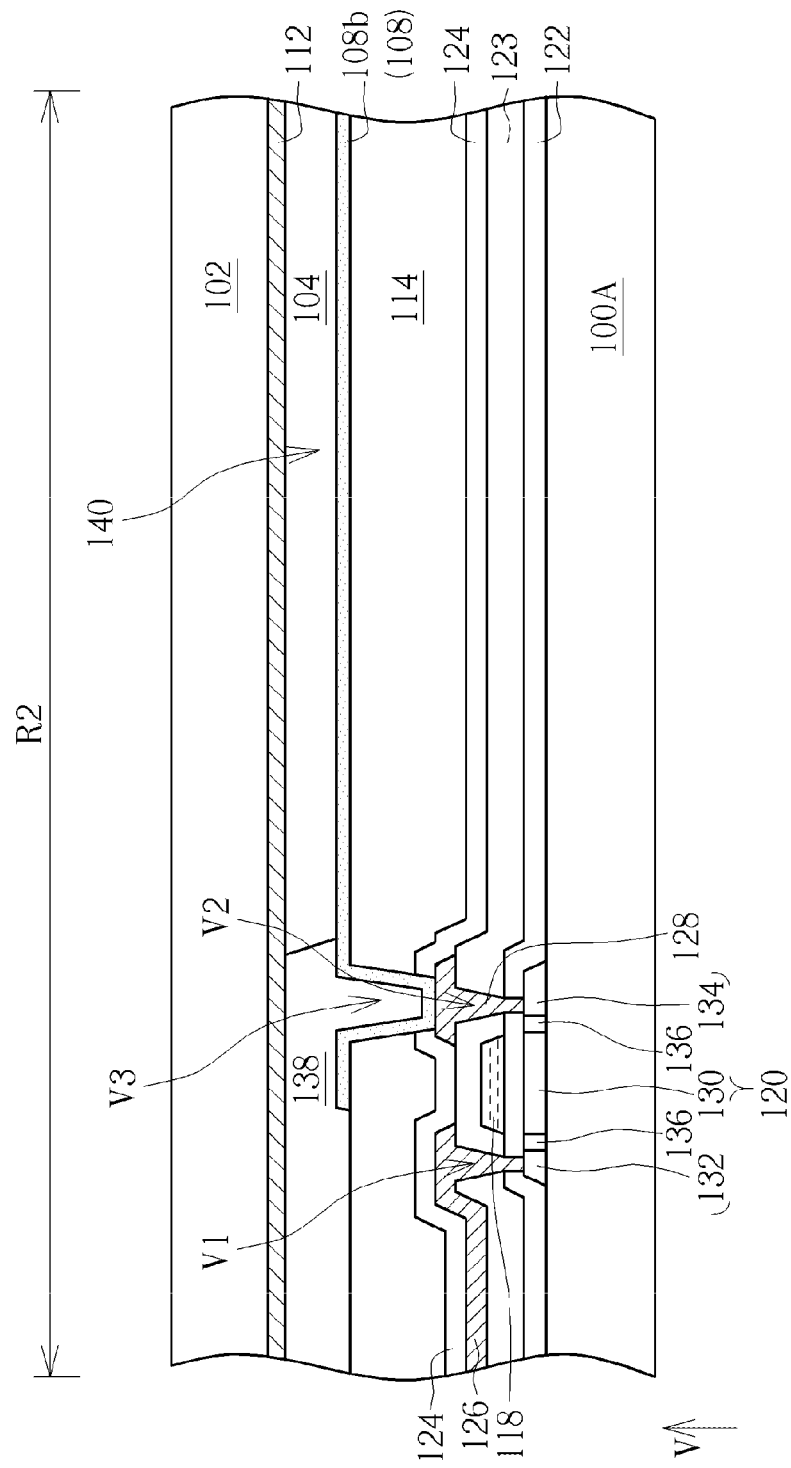
FIG. 4 is a schematic sectional view of a drive element electrically connected to a second pixel electrode according to FIG. 2.

Refer to FIG. 1 to FIG. 4. FIG. 1 is a schematic top view of a first substrate of a display panel of a first embodiment of the present disclosure; FIG. 2 is a schematic diagram of element configuration of a display panel of a first embodiment of the present disclosure; FIG. 3 is a schematic sectional view of a drive element electrically connected to a first pixel electrode according to FIG. 2; and FIG. 4 is a schematic sectional view of a drive element electrically connected to a second pixel electrode according to FIG. 2. FIG. 1 draws only control units 106, pixel electrodes 108, first signal lines SL1, and second signal lines SL2 on a first substrate 100A. FIG. 2 illustrates an electrical connection relationship between the control units 106 and the pixel electrodes 108 by using dashed lines, and shows that the pixel electrodes 108 are connected side by side. However, in fact, the pixel electrodes 108 are isolated from (or namely separated from) each other (as shown in FIG. 1). As shown in FIG. 1 and FIG. 2, a display panel 1 of this embodiment includes the first substrate 100A, a second substrate 102, and a medium display layer 104; the second substrate 102 is provided opposite to the first substrate 100A; and the medium display layer 104 is provided between the first substrate 100A and the second substrate 102. The first substrate 100A and the second substrate 102 are soft substrates having flexibility; the first substrate 100A and the second substrate 102 of this embodiment are plastic substrates as an example, wherein the second substrate 102 is a transparent plastic substrate as an example. Materials of at least one of the first substrate 100A or the second substrate 102 may include polyimide (polyimide, PI), polycarbonate (polycarbonate, PC), polyethersulfone (polyethersulfone, PES), polyacrylate (polyacrylate, PA), polynorbornene (polynorbornene, PNB), polyethylene terephthalate (polyethylene terephthalate, PET), polyetheretherketone (polyetheretherketone, PEEK), polyethylene naphthalate (polyethylene naphthalate, PEN), or polyetherimide (polyetherimide, PEI). However, the materials are not limited thereto and may be other various organic or inorganic materials, or organic/inorganic mixed materials. The medium display layer 104 is an organic light emitting material layer, that is, the display panel 1 of this embodiment is an organic light emitting diode (OLED) display panel, but the present disclosure is not limited thereto. In other embodiments, the display panel 1 may also be an inorganic light emitting diode display panel, that is, the medium display layer 104 can be an inorganic light emitting material layer. In more other embodiments, the display panel 1 can be other suitable display panel, that is, the medium display layer 104 can be a liquid crystal layer, an electrophoresis layer, an electro-wetting layer, an electrochromic layer, or another suitable medium display layer.

In detail, the first substrate 100A has at least one bendable area R1 and at least two non-bendable areas R2. This embodiment uses two non-bendable areas R2 and one bendable area R1 provided between the two non-bendable areas R2 as an example, but the number of the bendable area R1 and the number of the non-bendable areas R2 are not limited thereto. In other embodiments, the first substrate 100A has at least two bendable areas R1 and at least two non-bendable areas R2 (or may considered as two sub-non-bendable areas). However, the two bendable areas R1 are respectively located on two ends of the non-bendable areas R2; that is, the non-bendable areas R2 are located between the bendable areas R1. The display panel 1 includes a plurality of first signal lines SL1 that extend along a first direction D1 and a plurality of second signal lines SL2 that extend along a second direction D2. However, the bendable area R1 and the non-bendable areas R2 of this embodiment are adjacently side by side along the second direction D2. However, the present disclosure is not limited thereto. The first signal lines SL1 and the second signal lines SL2 are provided on the first substrate 100A; one of the first signal lines SL1 and one of the second signal lines SL2 are electrically connected to at least one subpixel SP. In this embodiment, that the first signal lines SL1 and the second signal lines SL2 intersect into a plurality of subpixels SP in the corresponding non-bendable areas R2 is used as an example, but the present disclosure is not limited thereto. In this embodiment, the first signal lines SL1 may be scanning lines GL and the second signal lines SL2 may be data lines DL, but the present disclosure is not limited thereto. In other embodiments, the first signal lines SL1 may be data lines DL and the second signal lines SL2 may be scanning lines GL, but the present disclosure is not limited thereto. Each of the subpixels SP includes a control unit 106, and the control units 106 are provided only in the non-bendable areas R2 and are not provided in the bendable area R1. In this embodiment, according to one type of the display panel, for example: an organic light emitting diode (OLED) display panel, then the control unit 106 at least includes a switch element SW, a drive element DR, and at least one storage capacitor element Cst, but the present disclosure is not limited thereto. The switch element SW and the drive element DR may both are transistors, for example, thin film transistors, which may be bottom gate thin film transistors, top gate thin film transistors, co-planner thin film transistors, or other types of suitable transistors. A gate electrode and a source electrode in the switch element SW may be electrically connected to the scanning lines GL and the data lines DL respectively, and the switch element SW can be controlled open (or namely turned on) by gate signals provided by the scanning lines GL, and the switch element SW can receive data signals provided by the data lines DL. A gate electrode of the drive element DR is electrically connected to a drain electrode of the switch element SW, and a source electrode and a drain electrode of the drive element DR are electrically connected to power cables (not shown) and the pixel electrodes 108 respectively. The control unit 106 of this embodiment has a 2T1C architecture, that is, includes two thin film transistor elements and one storage capacitor, but the present disclosure is not limited thereto. For example, the control unit 106 may also have a 4T2C architecture, a 2T2C architecture, a 5T1C architecture, a 6T1C architecture, or another architecture. In other embodiments, the type of the display panel may be a non-self-luminous display panel, for example: a liquid crystal panel; then the control unit 106 may include the switch element SW and at least one storage capacitor Cst, or several switch elements SW and at least one storage capacitor element Cst, but the present disclosure is not limited thereto.

The display panel 1 includes a plurality of pixel electrodes 108, which are provided in the bendable area R1 and the non-bendable areas R2 adjacently side by side, and each of the control units 106 is electrically connected to one of the pixel electrodes 108. In addition, this embodiment uses an organic light emitting diode (OLED) display panel as an example, and then the medium display layer 104 may include organic light emitting materials for providing different colors; the organic light emitting materials may be respectively provided on the pixel electrodes 108, and are provided in the bendable area R1 and the non-bendable areas R2, and the pixel electrodes 108 are respectively driven by means of the control units 106 of the subpixels SP, so that light of different colors mix to performed full color display. The medium display layer 104, for example, may include an organic light emitting material 105R that emits red light, an organic light emitting material 105G that emits green light, and an organic light emitting material 105B that emits blue light, but the present disclosure is not limited thereto. In other embodiments, the medium display layer 104 may emit light of one color, and then convert the light into light to a color needed by the display panel by means of a corresponding wavelength conversion element (not shown), for example: the medium display layer 104 may emit white light, and convert the white light by means of a wavelength conversion element (a multi-color photoresist, for example: a red photoresist, a green photoresist, a blue photoresist, or a photoresist of another color), or the medium display layer 104 may emit blue light or UV light, and convert the light by means of a wavelength conversion element (for example: a quantum dot/rod), to obtain light of different colors mix to perform full color display. The wavelength conversion element, for example: a color filter or a quantum dot/rod may be provided on the second substrate 102, for example: an outer surface or an inner surface of the second substrate 102, and may be also provided in the bendable area R1 and the non-bendable areas R2. In addition, in other modified embodiments, the wavelength conversion element, for example: a color filter or a quantum dot/rod may also be selectively provided on the medium display layer 114, rather than on the second substrate 102, and is provided in the bendable area R1 and the non-bendable areas R2, but not limited its. In this embodiment, the pixel electrodes 108 may be divided into first pixel electrodes 108a and second pixel electrodes 108b; the first pixel electrodes 108a are located in the bendable area R1, and the second pixel electrodes 108b are located in the non-bendable areas R2, but not limited its. Each of the first pixel electrodes 108a and the control unit 106 electrically connected thereto are not overlapping in a vertical projection direction V. However, each of the second pixel electrodes 108b is at least partially overlapping with the control unit 106 of the subpixel SP in the vertical projection direction V, and the control unit 106 is electrically connected to each of the second pixel electrodes 108b. The vertical projection direction V refers to a direction vertical to surfaces of the first substrate 100A and the second substrate 102; the vertical projection direction V is also vertical to a plane formed by the first direction D1 and the second direction D2. In addition to the function of flexibility, the bendable area R1 further has a display function. The bendable area R1 may include at least one column or row of the subpixels SP. Next, refer to FIG. 3. The display panel 1 of the present disclosure further includes a plurality of connection wires 110. Each of the first pixel electrodes 108a provided in the bendable area R1 are electrically connected to the control unit 106 through (or namely via) at least one of the connection wires 110. For example, the connection wire 110 may extend along a direction from the non-bendable areas R2 to the bendable area R1, and one end of the connection wire 110 is connected to the control unit 106 located in the non-bendable areas R2, for example: a drain electrode of the control unit 106; and the other end of the connection wire 110 is connected to the corresponding first pixel electrode 108a located in the bendable area R1, so that the first pixel electrodes 108a located in the bendable area R1 are electrically connected to the corresponding control units 106 located in the non-bendable areas R2. Therefore, the connection wires 110 substantially extend along the second direction D2, and cross part of the non-bendable areas R2, part of the bendable area R1, and a boundary between the bendable area R1 and the non-bendable areas R2. In addition, because the second pixel electrodes 108b are at least partially overlapping with the corresponding control units 106 in the vertical projection direction V, the second pixel electrodes 108b in this embodiment can be directly connected to the corresponding control units 106 as an example, and the connection wires 110 can be selectively not provided therebetween, but not limited its. In the display panel 1 of this embodiment, the pixel electrodes 108 and the medium display layer 104 not only are provided in the non-bendable areas R2, but also are provided in the bendable area R1 together. Therefore, the bendable area R1 can also display an image. By means of configuration of the connection wires 110, the control units 106 connected to the first pixel electrodes 108a can be provided in the non-bendable areas R2. In other words, even though the control units 106 corresponding to the first pixel electrodes 108a are not provided in the bendable area R1, the control units 106 corresponding to the first pixel electrodes 108a can still be electrically connected to the first pixel electrodes 108a by means of the connection wires 110, and drive the medium display layer 104 located in the bendable area R1 by using the first pixel electrodes 108a to display an image. In other words, the bendable area R1 can be increase the display area. Even the bendable area R1 is bent, the control units 106 electrically connected to the first pixel electrodes 108a are not damaged due to the control units 106 not disposed in the bendable area R1, so that the display panel 1 has outstanding reliability.

In each of the non-bendable areas R2, there is a distance between any two adjacent first signal lines SL1. Using the non-bendable area R2 on the left side in FIG. 1 as an example, in a direction from the non-bendable area R2 to the bendable area R1, there is a first distance X1, a second distance X2, and a third distance X3 between two adjacent first signal lines SL1. In this embodiment, the first distance X1 is greater than the second distance X2, and the second distance X2 is greater than the third distance X3. Similarly, using the non-bendable area R2 on the right side in FIG. 1 as an example, in a direction from the non-bendable area R2 to the bendable area R1, there is a first distance X1', a second distance X2', and a third distance X3' between two adjacent first signal lines SL1. In this embodiment, the first distance X1' is greater than the second distance X2', and the second distance X2' is greater than the third distance X3'. In other words, a larger distance from the bendable area R1 indicates a larger distance between the two adjacent first signal lines SL1. Compared with the subpixels SP having the second distances X2 and X2' or the third distances X3 and X3', the subpixels SP having the first distances X1 and X1' have a largest pixel area; the subpixels SP corresponding to the second distances X2 and X2' have a larger pixel area (or namely middle pixel area), and the subpixels SP that are closest to the bendable areas R2 and correspond to the third distances X3 and X3' have a small pixel area. Second, the first distance X1 is substantially equal to the first distance X1'; the second distance X2 is substantially equal to the second distance X2'; and the third distance X3 is substantially equal to the third distance X3'; that is, the non-bendable areas R2 located on the left and right sides of the bendable area R1 in FIG. 1 are substantially symmetrical on the left and the right, but the present disclosure is not limited thereto. In addition, the bendable area R1 of this embodiment has a first width W, which is greater than the first distance X1, but the present disclosure is not limited thereto. In addition, a larger distance between the second pixel electrodes 108b and the bendable area R1 indicates a larger area where each of the second pixel electrodes 108b is overlapping with the subpixel SP of the control unit 106 electrically connected to each of the second pixel electrodes 108b. In addition, the width W of the bendable area R1 may be greater than, substantially equal to, or less than the first distance X1 between two adjacent first signal lines SL1.

In addition, as shown in FIG. 2, the display panel 1 may selectively further includes a common electrode 112 provided on the second substrate 102, and the medium display layer 104 is provided between the common electrode 112 and the pixel electrodes 108, but not limited its. In other embodiments, the display panel 1 further includes the common electrode 112 provided on the medium display layer 104, and then the medium display layer 104 is provided between the common electrode 112 and the pixel electrodes 108. The pixel electrodes 108 may be also called bottom electrodes or anodes, and the common electrode 112 may be also called a top electrode or a cathode, but not limited its. The pixel electrodes 108 may be transparent or non-transparent electrodes. The pixel electrodes 108 of this embodiment may be single-layered or multi-layered, and a material thereof may be a metal, an alloy, the foregoing nitride, the foregoing oxide, the foregoing oxynitride, or another suitable material, and can be used as a reflecting layer. However, the common electrode 112 may be single-layered or multi-layered, and a material thereof may be an indium tin oxide (ITO), an indium zinc oxide (IZO), an indium gallium zinc oxide (IGZO), an indium gallium oxide (IGO), a gallium zinc oxide (GZO), a carbon nanotube/rod, a metal or an alloy less than 60 A, and can be used as a transparent electrode. Therefore, the display panel 1 of this embodiment is a top light emitting type of an organic light emitting diode display panel; light emitted by the medium display layer 104 can penetrate through the common electrode 112 for providing a display effect, but the present disclosure is not limited thereto. In other modified embodiments, the display panel 1 of this embodiment may be also a bottom light emitting type of an organic light emitting diode display panel. In this case, the material of the common electrode 112 may be selected from the foregoing materials, and the common electrode 112 may be a reflecting layer. The material of the pixel electrodes 108 may be selected from the foregoing materials, and the pixel electrodes 108 may be transparent electrodes, so that light emitted by the medium display layer 104 can penetrate through the pixel electrodes 108 to provide a display effect. Alternatively, the material of the common electrode 112 may be selected from the foregoing materials, and the common electrode 112 may be a transparent electrode. The material of the pixel electrodes 108 may be selected from the foregoing materials, and the pixel electrodes 108 may be transparent electrodes, so that light emitted by the medium display layer 104 can penetrate through the pixel electrodes 108 and the common electrode 112 to provide a double-side display. The pixel electrodes 108 in the display panel 1 of this embodiment have substantially the same area size, but the present disclosure is not limited thereto. In other modified embodiments, the pixel electrodes 108 may have different area size. For example, because the light emitting efficiency of an organic material for emitting blue light is poor, the organic material may be provided with the pixel electrode 108 with a large area, so that the organic material has a large light emitting area. In addition, this embodiment uses an organic light emitting diode display panel as an example, and then the medium display layer 104 of the display panel 1 may include an electron hole transmission layer (not shown) and an electron transmission layer (not shown), where the electron hole transmission layer is provided on a side of the medium display layer 104, which is close to the pixel electrodes 108, and the electron transmission layer is provided on a side of the medium display layer 104, which is close to the common electrode 112, but the present disclosure is not limited thereto. In other embodiments, if the display panel 1 is a liquid crystal display panel, an electrophoresis display panel, an electro-wetting display panel, or an electrochromic display panel, then the medium display layer 104 is a material respectively corresponding thereto, for example: the medium display layer 104 of the liquid crystal display panel may be a liquid crystal layer.

The display panel 1 may selectively further include a flat layer 114 and an insulation layer 116 (see FIG. 2). The flat layer 114 is provided in the bendable area R1 and the non-bendable areas R2, and is provided between the pixel electrodes 108 and the control units 106. The flat layer 114 may be a single-layer or multi-layer structure, and a material thereof may include an organic material, but not limited its. The insulation layer 116 is provided in the bendable area R1 and the non-bendable areas R2, and is provided between the flat layer 114 and the first substrate 100A. The insulation layer 116 may be single-layered or multi-layered, and a material thereof, preferably, includes an inorganic material (for example, silicon oxide, silicon nitride, silicon oxynitride, or other suitable materials), and may be, for example, at least one of a buffer layer, a gate insulation layer, or an interlayer dielectric layer of a thin film transistor, and may extend from the non-bendable areas R2 to the bendable area R1. In other embodiments, the material of the insulation layer 116 may also include an organic material (for example: a photoresist, polyimide, or other suitable materials).

The switch element SW and the drive element DR may an inorganic thin film transistor or an organic thin film transistor, and the thin film transistor may be selected from a top gate transistor, a bottom gate transistor, or other types of transistor. As shown in FIG. 3, in this embodiment, the drive element DR of the control units 106 connected to the first pixel electrodes 108a is (but not limited to) a top gate thin-film transistor, and includes a gate 118, a semiconductor layer 120, a gate insulation layer 122, an interlayer dielectric layer 123, a protection layer 124, a source electrode 126, and a drain electrode 128. The gate electrode 118 is provided on the first substrate 100A. The gate insulation layer 122 is provided between the gate electrode 118 and the first substrate 100A. The semiconductor layer 120 may be, for example, a polycrystalline silicon semiconductor layer, provided between the gate insulation layer 122 and the first substrate 100A, and is at least partially overlapping with the gate electrode 118 in a vertical projection direction. A material of the semiconductor layer 120 is not limited to polycrystalline silicon, and may be another suitable semiconductor, for example, another semiconductor layer (for example, amorphous silicon, microcrystalline silicon, or another suitable semiconductor material), an oxide semiconductor layer, for example, an indium gallium zinc oxide (IGZO), or another suitable semiconductor material. The semiconductor layer 120 includes a channel region 130, contact ends (or called heavily doped semiconductor regions) 132 and 134 that are respectively located on two sides of the channel region 130, two lightly doped semiconductor regions 136 that are respectively located between the contact end 132 and the channel region 130 and between the contact end 134 and the channel region 130. Resistivity ($\Omega$m) of the contact ends 132 and 134 is less than that of the lightly doped semiconductor region 136, and resistivity of the lightly doped semiconductor region 136 is less than that of the channel region 130. The interlayer dielectric layer 123 is provided on the gate electrode 118. The interlayer dielectric layer 123 and the gate insulation layer 122 have two contact holes V1 and V2. The source 126 and the drain 128 are provided on the interlayer dielectric layer 123, and contact the contact ends 132 and 134 of the semiconductor layer 120 respectively by the contact holes V1 and V2. In addition, one end of the connection wire 110 is connected to the drain electrode 128, and extends into the bendable area R1 from the non-bendable areas R2. In this embodiment, the source electrode 126, the drain electrode 128, and the connection wires 110 preferably may be a same patterned conductive layer, and may be manufactured at the same time, but the prevent disclosure is not limited thereto. In other embodiments, the source electrode 126, the drain electrode 128, and the connection wires 110 may be manufactured as different conductive layers. The protection layer 124 is provided on the source electrode 126, the drain electrode 128, and the connection wires 110. In addition, the display panel 1 of this embodiment may selectively further include a buffer layer (not shown) provided between the first substrate 100A and the semiconductor layer 120. At least one of the buffer layer (not shown), the gate insulation layer 122, the interlayer dielectric layer 123, or the protection layer 124 may be single-layered, or multi-layered, and materials thereof may be inorganic materials (for example, silicon oxide, silicon nitride, silicon oxynitride, or other suitable materials) and organic materials (for example, photoresists, polyimide, or other suitable materials). Because a transistor (for example: a thin film transistor) is not provided in the bendable area R1, therefore, a thickness from an inner surface of the first substrate 100A to a top surface of the protection layer 124 in the bendable area R1 (that is, a thickness of the insulation layer 116 shown in FIG. 2), preferably is less than a thickness from an inner surface of the first substrate 100A to a top surface of the protection layer 124 in the non-bendable areas R2, as shown in FIG. 2.

Next, refer to FIG. 3. The flat layer 114 is provided on the protection layer 124. The protection layer 124 and the flat layer 114 have a contact hole V3 in the bendable area R1. The first pixel electrodes 108a are provided on a part of the flat layer 114 in the bendable area R1, and contact the connection wires 110 by the contact hole V3. The display panel 1 of this embodiment selectively further includes a patterned bank 138, which is located on the flat layer 114 and has an opening 140, so that some of the first pixel electrodes 108a are not covered by the patterned bank 138, and the medium display layer 104, for example: a light emitting material layer, is provided in the opening 140. The common electrode 112 and the second substrate 102 are provided on the patterned bank 138 (also called a pixel defining layer) and the medium display layer 104. In addition, a spacer (not shown) may be selectively provided on the display panel 1, where the spacer is provided between the second substrate 102 and the patterned bank 138.

As shown in FIG. 4, the drive element DR of the control units 106 electrically connected to the second pixel electrodes 108b does not have the connection wires 110, and the flat layer 114 and the protection layer 124 have the contact hole V3. The second pixel electrodes 108b contact the drain electrode 128 by the contact hole V3. Compared with FIG. 3, the contact hole V3 in FIG. 4 is located on the contact hole V2, and the contact hole V3 is partially overlapping with the contact hole V2 in a vertical projection direction V, and the contact hole V3 in FIG. 3 is not overlapping with the contact hole V2 in the vertical projection direction V. Configuration of other elements of the display panel 1 in FIG. 4 is substantially similar to FIG. 3, and details are not described herein.

The display panel of the present disclosure is not limited to the foregoing embodiment. Display panels of other preferred embodiments of the present disclosure will be sequentially introduced below. In addition, to facilitate comparing differences between the embodiments and for the brevity of description, same reference signs are used to denote same elements in the following embodiments, and mainly the differences between the embodiments are described, and the same part will not be described repeatedly.

Figure 5:
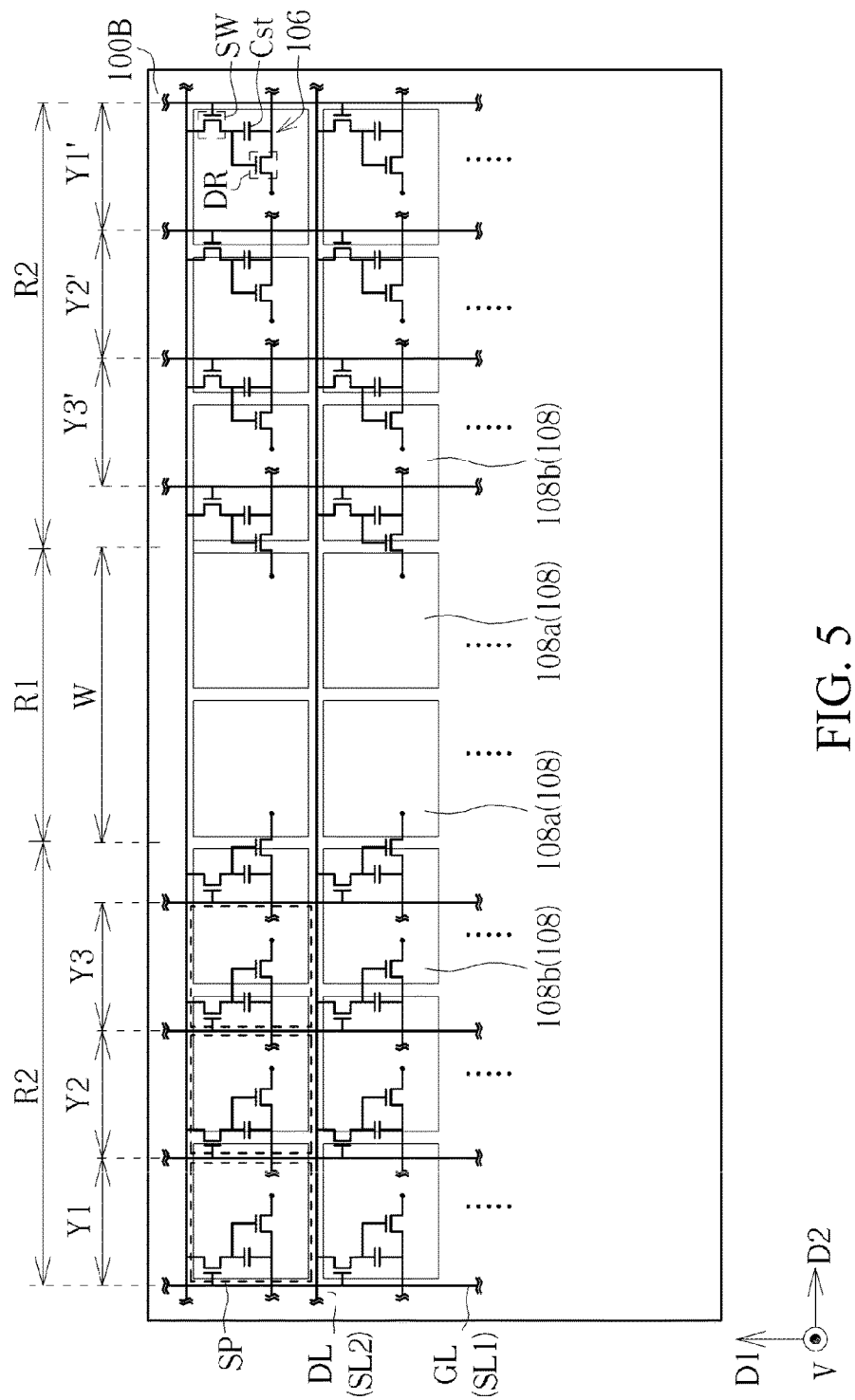
FIG. 5 is a schematic top view of a first substrate of a display panel of a modified embodiment of a first embodiment of the present disclosure.

Referring to FIG. 5, FIG. 5 is a schematic top view of a first substrate of a display panel of a modified embodiment of a first embodiment of the present disclosure. To highlight features of a display panel of this modified embodiment, FIG. 5 draws only control units 106, pixel electrodes 108, first signal lines SL1, and second signal lines SL2 on a first substrate 100B. As shown in FIG. 5, this modified embodiment differs from the first embodiment in that, there is a substantially same distance between any two adjacent first signal lines SL1 in non-bendable areas R2. Using the non-bendable area R2 on the left side in FIG. 5 as an example, in a direction from the non-bendable area R2 to a bendable area R1, there is a first distance Y1, a second distance Y2, and a third distance Y3 between two adjacent first signal lines SL1, and the first distance Y1, the second distance Y2, and the third distance Y3 are substantially equal to each other. Similarly, using the non-bendable area R2 on the right side in FIG. 5 as an example, in a direction from the non-bendable area R2 to the bendable area R1, there is a first distance Y1', a second distance Y2', and a third distance Y3' between two adjacent first signal lines SL1, and the first distance Y1', the second distance Y2', and the third distance Y3' are substantively equal to each other. Second, in this modified embodiment, the first distance Y1 is substantially equal to the first distance Y1; the second distance Y2 is substantially equal to the second distance Y2'; and the third distance Y3 is substantially equal to the third distance Y3'. Therefore, subpixels SP of the control units 106 correspondingly electrically connected to second pixel electrodes 108b have a substantially same area size. In addition, other features of a display panel 1 of this modified embodiment may be substantially similar to the foregoing embodiment, and refer to FIG. 3 and FIG. 4 for details, which are not described herein again.

Figure 6:
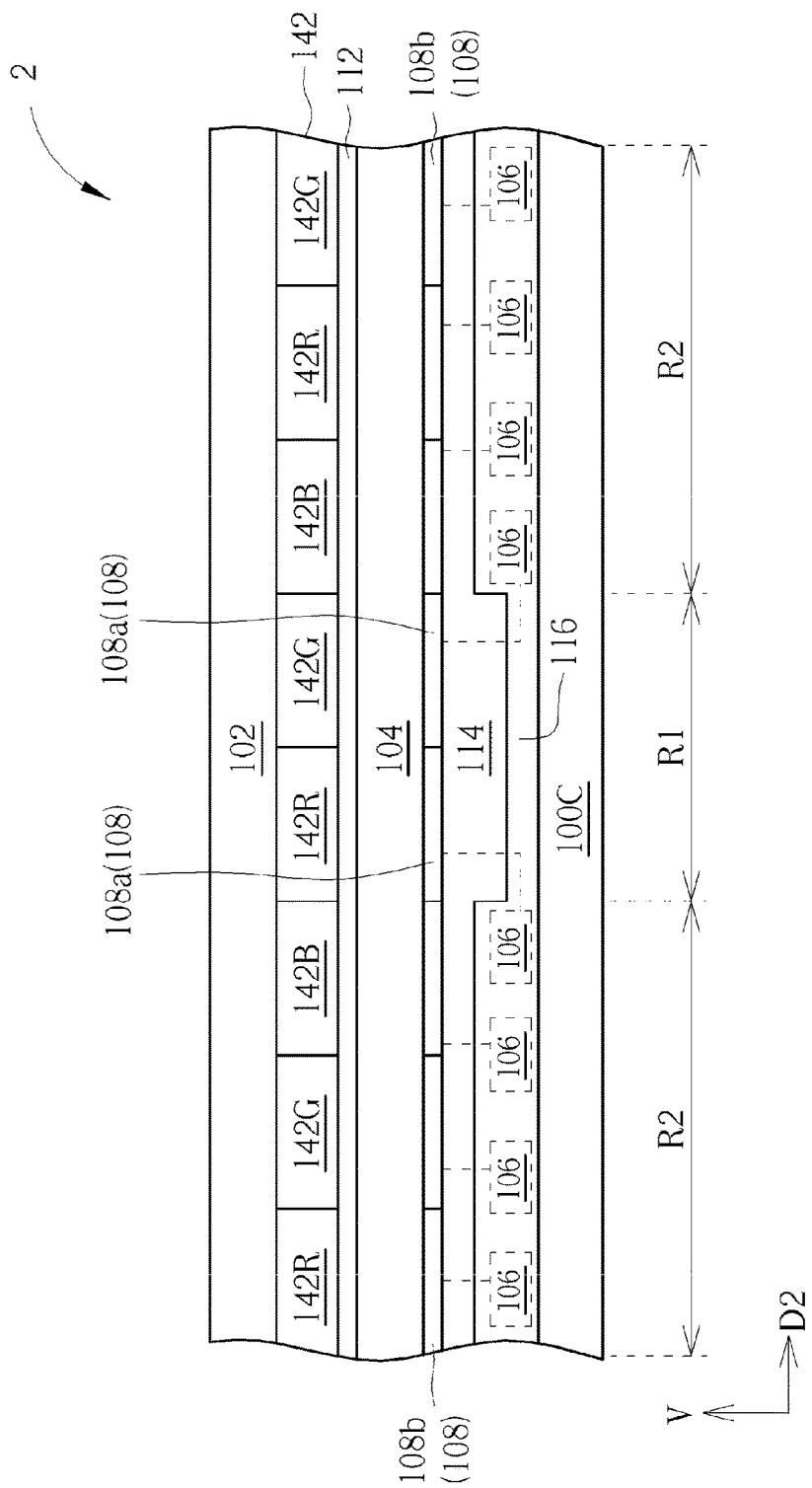
FIG. 6 is a schematic diagram of element configuration of a display panel of a second embodiment of the present disclosure.
Figure 7:
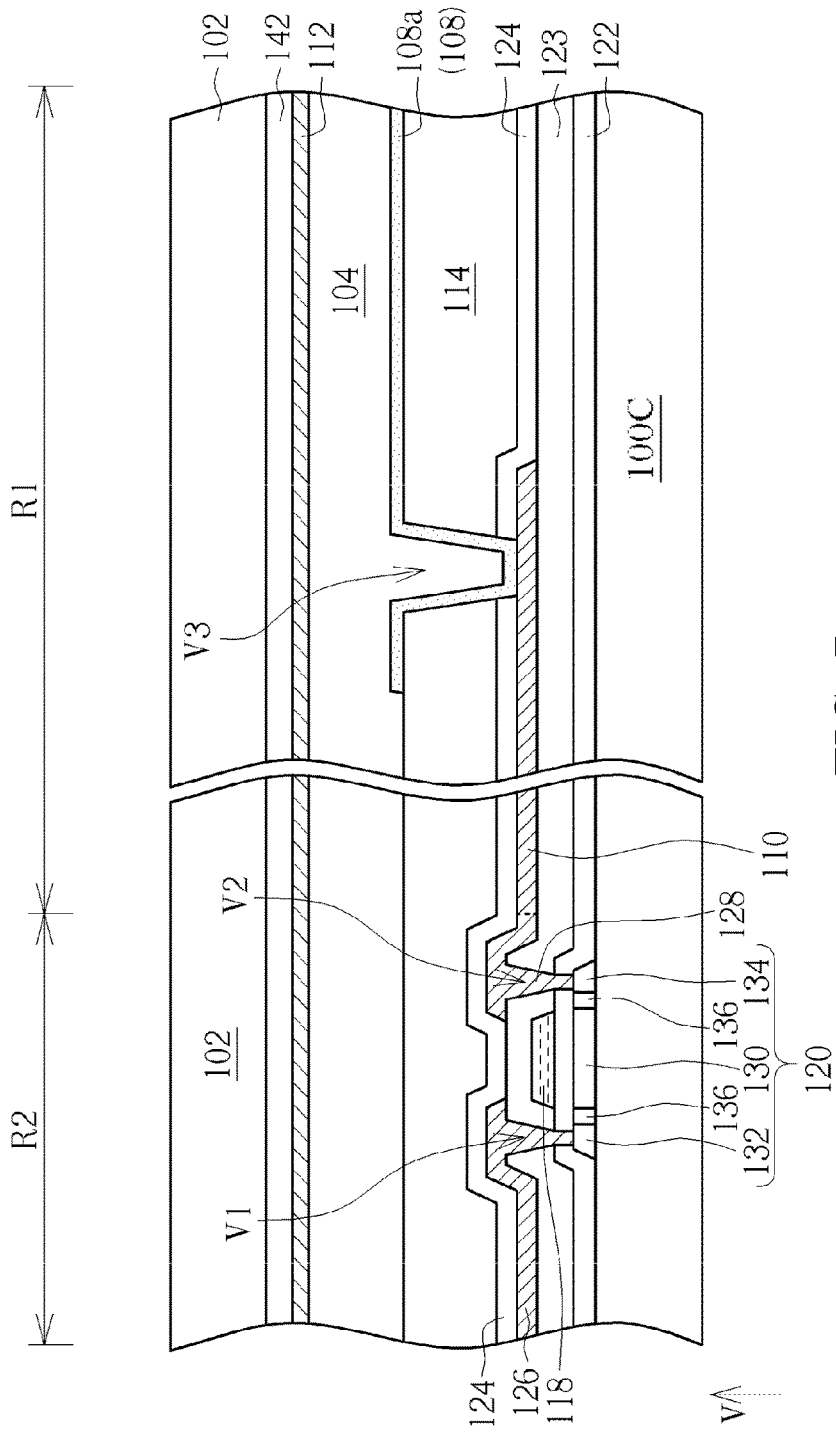
FIG. 7 is a schematic sectional view of a drive element electrically connected to a first pixel electrode according to FIG. 6.
Figure 8:
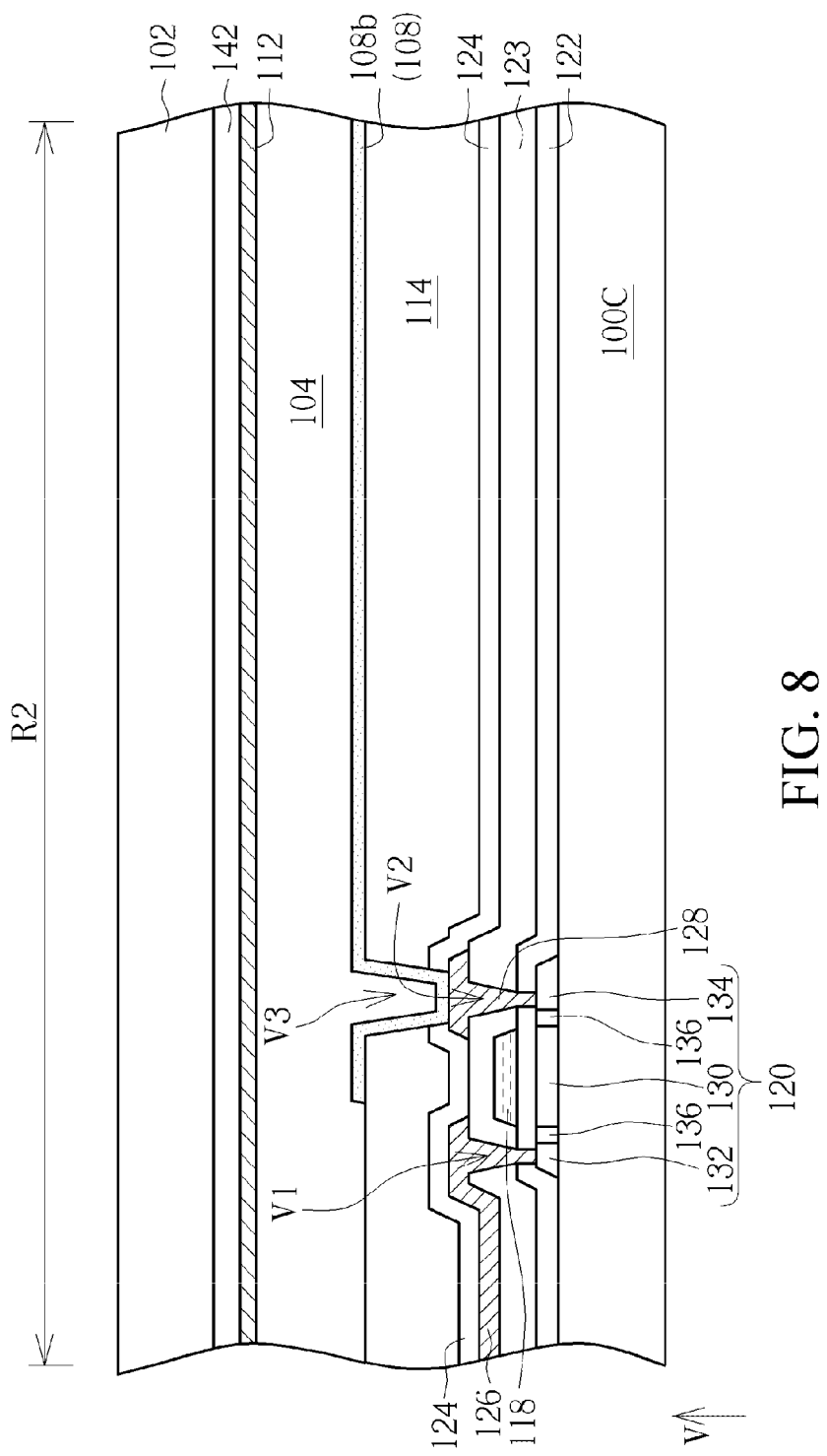
FIG. 8 is a schematic sectional view of a drive element electrically connected to a second pixel electrode according to FIG. 6.

Refer to FIG. 6 to FIG. 8. FIG. 6 is a schematic diagram of element configuration of a display panel of a second embodiment of the present disclosure; FIG. 7 is a schematic sectional view of a drive element electrically connected to a first pixel electrode according to FIG. 6; and FIG. 8 is a schematic sectional view of a drive element electrically connected to a second pixel electrode according to FIG. 6. As shown in FIG. 6 to FIG. 8, this embodiment differs from the first embodiment in that, a medium display layer 104 of a display panel 2 of this embodiment, for example, may be a liquid crystal layer, and therefore, the display panel 2 is a liquid crystal display panel, and the liquid crystal display panel does not have a patterned bank 138. The medium display layer 104 is provided between the pixel electrodes 108 and the common electrode 112, and the pixel electrodes 108 and the common electrode 112 both are transparent electrodes. In other modified embodiments, the pixel electrodes 108 and the common electrode 112 may be also provided between the medium display layer 104 and a first substrate 100C, for example, the display panel 2 may be a liquid crystal display panel of an in-plane switching type, a liquid crystal display panel of a fringe field switching type, or the like. Control units 106 in the display panel 2 may include at least one switch element and at least one storage capacitor element, where the switch element may be a thin film transistor, but is not limited thereto.

In addition, the display panel 2 further includes a color filter (or a quantum dot/rod) 142, which is provided between a second substrate 102 and the medium display layer 104, and may be provided in the bendable area R1 and the non-bendable areas R2. In addition, in other modified embodiments, the color filter (or the quantum dot/rod) 142 may also be selectively provided between the first substrate 100C and the medium display layer 104, and then the color filter 142 may be called a color filter on array (COA). The color filter 142 includes a plurality of parts having different colors, which are provided corresponding to the pixel electrodes 108 respectively. For example, the color filter 142 may include a red part 142R, a green part 142G, and a blue part 142B, and the red part 142R, the green part 142G, and the blue part 142B may have substantially same sizes, but the present disclosure is not limited thereto. The display panel 2 of this embodiment may further include elements that are necessarily configured on a liquid crystal display panel, for example, an alignment film, a black matrix pattern, or a polarizer, and functions, configurations, and the like thereof are well known to persons of ordinary skill in the art, and details are not described herein. In addition, other features of the display panel 2 of this embodiment, for example: FIG. 6 to FIG. 8, may be substantially similar to the first embodiment and the modified embodiment thereof, and refer to FIG. 1 to FIG. 5 for details, which are not described herein again. For example, as shown in FIG. 1 and FIG. 5, the display panel 2 may be also substantially similar to the first embodiment and the modified embodiment thereof; there is a distance between any two adjacent first signal lines SL1 in each of the non-bendable areas R2; and a larger distance to the bendable area R1 indicates a larger distance between the any two adjacent first signal lines SL1, or sizes of all distances are substantially equal.

Based on the above, the pixel electrodes and the medium display layer of the display panel of the present disclosure not only are provided in non-bendable areas, but also are provided in a bendable area together. Therefore, the non-bendable areas and the bendable area both can display an image. In the display panel of the present disclosure, control units connected to first pixel electrodes by connection wires in the bendable area so that control units can be provided in the non-bendable areas. In this way, even though the control units electrically connected to the first pixel electrodes are not provided in the bendable area, the control units electrically connected to the first pixel electrodes can still drive the medium display layer located in the bendable area by the connection wires and the first pixel electrodes to display an image. In other words, the bendable area R1 can be increase the display area. Therefore, even though the bendable area R1 is bent, the control units electrically connected to the first pixel electrodes can still prevent from being damaged, so that the display panel has outstanding reliability.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present disclosure pertains without departing from its spirit and scope. Accordingly, the scope of the present disclosure is defined by the appended claims rather than the foregoing description and the exemplary embodiments described therein.

What is claimed is:

1. A pixel structure, comprising:
a first substrate, having at least one bendable area and at least one non-bendable area;
a plurality of first signal lines and a plurality of second signal lines, provided on the first substrate, wherein one of the first signal lines and one of the second signal lines are electrically connected to at least one of a plurality of subpixels, and each of the subpixels comprises a control unit, and the control units are provided only in the at least one non-bendable area and are not provided in the at least one bendable area; and
a plurality of pixel electrodes, provided in the bendable area and the at least one non-bendable area, wherein any two adjacent pixel electrodes of the plurality of pixel electrodes are provided side by side, and each of the control units is electrically connected to one of the pixel electrodes;
wherein the pixel electrodes comprise a plurality of first pixel electrodes provided in the bendable area, and the control units correspondingly comprise a plurality of first control units;
wherein each of the first pixel electrodes is electrically connected to a corresponding one of the first control units, and the first pixel electrodes are not overlapping with the corresponding ones of the first control units in a vertical projection direction.

2. The pixel structure according to claim 1, further comprising a plurality of connection wires, wherein the first pixel electrodes provided in the at least one bendable area are electrically connected to the first control units through one of the connection wires.

3. The pixel structure according to claim 1, wherein the pixel electrodes comprise a plurality of second pixel electrodes, provided in the at least one non-bendable area; the control units correspondingly comprise a plurality of second control units, the second pixel electrodes are partially overlapping with corresponding ones of the second control units respectively in the vertical projection direction; and the second control units are electrically connected to the corresponding second pixel electrodes respectively.

4. The pixel structure according to claim 1, wherein the first signal lines extend along a first direction; the second signal lines extend along a second direction; and the at least one non-bendable area and the at least one bendable area are side by side along the second direction.

5. The pixel structure according to claim 4, wherein there is a distance between any two adjacent first signal lines in the at least one non-bendable area, the at least one bendable area has a width, and the width is greater than the distance.

6. The pixel structure according to claim 4, wherein in the at least one non-bendable area, there is a distance between any two adjacent first signal lines, and the distance between the adjacent first signal lines increases with an increased distance between the first signal lines and the bendable area.

7. The pixel structure according to claim 4, wherein in the at least one non-bendable area there is a distance between any two adjacent first signal lines, and the distances are substantial the same.

8. The pixel structure according to claim 1, wherein the first signal lines are one of data lines and scanning lines; the second signal lines are the other of the data lines and the scanning lines; each of the data lines is electrically connected to a source electrode of one of the control units, and each of the scanning lines is electrically connected to a gate electrode of one of the control units.

9. The pixel structure according to claim 1, wherein each of the control units comprises at least one transistor.

10. The pixel structure according to claim 1, wherein the first substrate has a plurality of non-bendable areas, and the at least one bendable area is located between the non-bendable areas.

11. A display panel, comprising:
the pixel structure according to claim 1;
a second substrate, provided opposite to the first substrate; and
a medium display layer, provided between the first substrate and the second substrate.

12. The display panel according to claim 11, wherein the medium display layer is a light emitting material layer.

13. The pixel structure according to claim 4, wherein the subpixels in the at least one non-bendable area have different widths in the second direction, and for each of the subpixels in the at least one non-bendable area, the width of each of the subpixels in the at least one non-bendable area increases with an increased distance of each of the subpixels in the at least one non-bendable area from the at least one bendable area.

* * * * *